HIGH LEVEL A. M. MODULATION
Filed Sept. 16, 1955
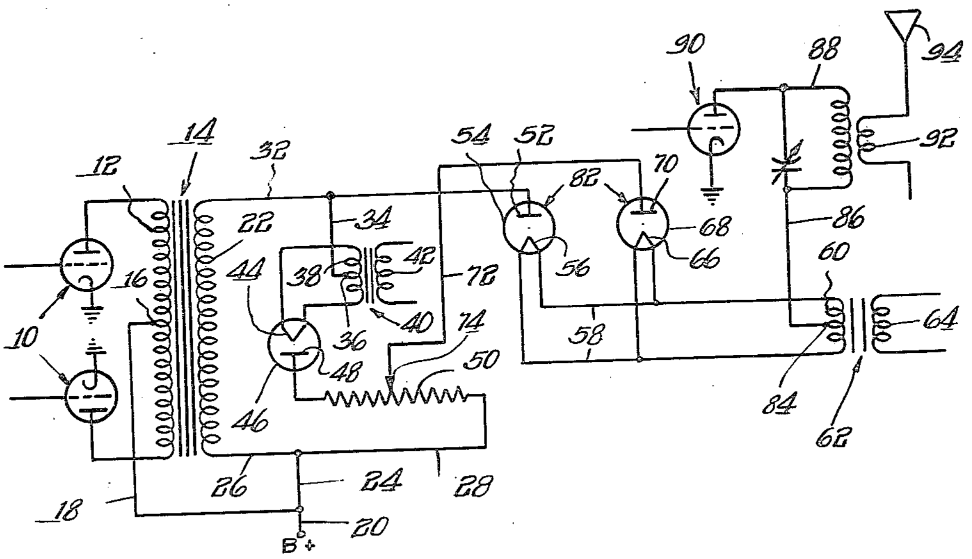
INVENTORS
Joseph D. Liga
Vincent A. Abbatiello
By: Olson & Trexler Attys.

United States Patent Office 2,846,651

Patented Aug. 5, 1958

2,846,651

HIGH LEVEL A. M. MODULATION

Joseph D. Liga, Eatontown, and Vincent A. Abbatiello, New Shrewsbury, N. J.

Application September 16, 1955, Serial No. 534,698

1 Claim. (Cl. 332—38)

This invention is concerned with the art of radio broadcasting, and more particularly with high level A.M. modulation.

In conventional low level modulation the carrier is modulated at a low power level and then is amplified with class "B" or high efficiency linear amplification to the desired power level for transmission. The modulator need furnish side-band power that is only a fraction of the full side-band power output of the transmitter. However, the amplifiers for the modulator wave must be linear, either class "B" R. F. amplifiers or high efficiency linear amplifiers of special design. High level modulation often is resorted to, and in this method of modulation the carrier is modulated at high power levels in the final stage or power amplifier. The necessity of a large number of class "B" R. F. amplifiers thus is obviated. However, the audio power output of the modulator must be equal to one half of the D. C. power input of the modulated amplifier for one hundred percent modulation at an efficiency equal to that at which the carrier output is produced by the modulated amplifier. Heretofore, various expedients such as clipping, suppression, compression, filtering, et cetera of the audio have been necessary to prevent overmodulation.

In U. S. patent application Ser. No. 502,553, filed April 20, 1955, by Ollie James Allen, and entitled "High Level A.M. Modulation," there is disclosed and claimed a system for high level A.M. modulation obviating the difficulties heretofore found in high level A.M. modulation, and positively preventing overmodulation. More specifically, the Allen application discloses a system wherein an electronic switch automatically connects a fixed holding voltage during a predetermined portion of negative half cycles of modulating voltage to limit negative modulation to less than one hundred percent while permitting positive modulation of well over one hundred percent. In accordance with the Allen application the negative half cycles are squared off, so the negative half cycles are not faithful reproductions of the modulating intelligence.

This invention represents an improvement over the Allen system, and the principal object is to eliminate the disadvantages in the Allen system.

More specifically, it is an object of this invention to provide a high level A.M. modulation circuit wherein the negative half cycle is a faithful reproduction of the modulating input similar to the positive half cycle, but at a reduced amplitude.

It is another object of this invention to provide a high level A.M. modulation circuit wherein an electronic switch connects the modulating negative half cycles superimposed on a D. C. voltage to limit the amplitude of negative modulation while retaining the character thereof.

A further object of this invention is to provide a high level A.M. modulation circuit producing a minimum bandwidth.

Other and further objects and advantages of the present invention will be apparent from the following description when taken in connection with the accompanying drawing, wherein:

The figure represents a preferred form of our high level A.M. modulation circuit.

Throughout the following description and in the accompanying drawing detail as to conventional parts has been kept at a minimum to preclude obscuring the essentials of the invention. Thus, in the figure the output stage of a modulating transformer is indicated generally by a pair of push-pull output tubes 10 having their plates connected to the primary winding 12 of a modulation transformer 14. The tubes are illustrated simply as triodes, but it will be understood that any other type of tubes suitable for the purpose could be used. The transformer primary winding 12 is provided with a center tap at 16 in accordance with conventional practice, and this center tap is connected by means of wires 18 and 20 to any suitable source of B+ voltage for supplying D. C. plate power to the tubes 10.

The secondary winding 22 of the modulation transformer is connected at one end by means of a wire 26 to a wire 24 leading to the B+ wire 20. The wire 26 also is connected by means of a wire 28 to one end of a potentiometer resistor 50.

The opposite end of the secondary winding 22 is connected to a wire 32. This wire, in turn, is connected to a wire 34 leading to the center tap 36 of the secondary winding 38 of a filament transformer 40. The primary winding 42 of the filament transformer is connected to a source of 110-volt A. C. potential. The ends of the secondary 38 are connected to the heater-cathode 44 of a diode rectifier tube 46. The plate 48 of the diode 46 is connected to the opposite end of the resistor 50.

The wire 32 also is connected to the plate 52 of a diode switch tube 54. The heater-cathode 56 of this tube is connected by a pair of wires 58 to the opposite ends of the secondary 60 of a filament transformer 62. The primary winding 64 of this transformer is connected to a suitable source of 110-volt A. C. potential. The heater-cathode 66 of a second diode switch tube 68 is connected to the wires 58. Hence, the heater-cathodes 56 and 66 are connected in parallel with one another, and are maintained at the same potential. The plate 70 of the tube 68 is connected by means of a wire 72 to the sliding tap 74 on the potentiometer resistor 50.

The two diode switch tubes 54 and 68 together form an electronic switch 82, and it will be understood that the two tubes 54 and 68 could comprise the two diode sections of a duodiode or full wave rectifier tube. The primary winding 60 of the filament transformer is center tapped at 84, and the center tap is connected by means of a wire 86 to the tuned circuit 88 of a class "C" R. F. power amplifier indicated generally at 90. The tuned circuit is inductively coupled at 92 to an antenna conventionally indicated at 94.

When the modulating voltage from the modulation transformer 14 acts as positive modulation, the voltage will be superimposed on the high D. C. voltage obtained from the B+ wire 20, and this voltage will pass through the circuit including the diode rectifier 54 to the power amplifier. The magnitude of the composite voltage can be extremely great, and can be at any level within the limitations of the circuit components. A half cycle later when the modulation swings negative, the modulating voltage will tend to drive the plate voltage of the amplifier tube 90 to zero or less if the percentage of modulation is one hundred percent or greater. However, the voltage picked off of the potentiometer 50 by the sliding tap 74 prevents this. Once the voltage on the wire 32 drops below the voltage at the tap 74, the tube 68 starts to conduct, and the tube 54 stops conducting.

It will be appreciated that the rectifier tube 46 does not conduct on positive half cycles, but does conduct on negative half cycles. Accordingly, the voltage picked off by the tap 74 comprises a fixed, predetermined D. C. voltage obtained by the potentiometer resistor 50 from the B+ wire 20 with an A. C. modulating voltage from the tube 46 superimposed thereon. Consequently, the voltage appearing at the tap 74 is a replica of the negative half cycle of modulating voltage, but having a reduced amplitude as determined by the position of the tap 74 on the potentiometer resistor 50. Accordingly, the entire negative half cycle of modulating voltage is faithfully reproduced, the same as the positive half cycle, but at a reduced amplitude.

The sliding tap 74 on the potentiometer resistor 50 preferably is adjusted to provide sufficient A. C. audio voltage for 90–95 percent modulation of the negative half cycles at the maximum level of audio input to the modulators.

As a result, the entire audio modulating wave is faithfully reproduced. The absence of "squaring off" action which would be caused by completely cutting off the negative half cycle or a portion thereof results in a minimum band width of the signal on the air.

The only limit on the percentage of modulation that can be accomplished by this circuit is the limitations of the tubes and electrical components themselves. It is possible to modulate any carrier with as much audio as it is possible for a transmitter to generate without causing overmodulation.

This circuit can be incorporated into any A.M. transmitter to provide maximum audio within the capabilities of the transmtter audio system without overmodulation. It will increase the range, coverage, and usable power of any transmitting station. The circuit is useful in commercial broadcasting, amateur radio, aircraft radio, industrial radio, and countless other applications far too numerous to mention.

The specific embodiment of the invention herein shown and described will be understood as being by way of illustration only. Various changes in the specific circuits shown and described will no doubt occur to those skilled in the art, and will be understood as forming a part of the invention insofar as they fall within the spirit and scope of the appended claim.

The invention is claimed as follows:

An A.M. modulation circuit comprising a carrier amplifier stage having an input connection for a modulating voltage, a modulation transformer having input and output windings, said output winding providing an alternately relatively positive and negative modulating voltage when a modulation voltage is applied to the input windings, a source of D. C. potential, means connecting one end of the output winding to said source of D. C. potential, a rectifier device, means connecting the cathode end of said rectifier device to the other of said output winding, a potentiometer, means connecting said potentiometer to said source of D. C. potential and to the anode of said rectifier device, no point on said potentiometer being grounded whereby modulating voltage is fed back to said rectifier device to prevent distortion, an electronic switch including a pair of rectifiers each having an anode and a cathode, means connecting the anode of one of said rectifiers to said other end of said output winding, means including a tap on said potentiometer connecting the anode of the second rectifier to the potentiometer, means connecting the cathodes of said rectifiers in parallel to said input connection whereby said electronic switch alternately evects connection of said other end of said output winding and the tap on said potentiometer to said input connection.

References Cited in the file of this patent

UNITED STATES PATENTS

| | | |
|---|---|---|
| 2,285,896 | Brown | June 9, 1942 |
| 2,493,484 | Franklin | June 3, 1950 |